United States Patent
Vinson et al.

(10) Patent No.: US 7,286,348 B2
(45) Date of Patent: Oct. 23, 2007

(54) HOUSING ASSEMBLY FOR A COMPUTER

(75) Inventors: Wade D. Vinson, Magnolia, TX (US); Egons Dunens, Spring, TX (US); Rich Bargerhuff, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 252 days.

(21) Appl. No.: 10/989,922

(22) Filed: Nov. 16, 2004

(65) Prior Publication Data

US 2006/0104027 A1    May 18, 2006

(51) Int. Cl.
*H05K 7/20* (2006.01)

(52) U.S. Cl. ........................ 361/695; 361/694; 454/184

(58) Field of Classification Search ................ None
See application file for complete search history.

(56) References Cited

U.S. PATENT DOCUMENTS

| | | | |
|---|---|---|---|
| 5,177,666 A | 1/1993 | Bland et al. | |
| 5,361,188 A * | 11/1994 | Kondou et al. | 361/695 |
| 5,931,002 A * | 8/1999 | Nagashima | 62/3.7 |
| 6,113,485 A * | 9/2000 | Marquis et al. | 454/184 |
| 6,421,240 B1 | 7/2002 | Patel et al. | |
| 6,459,578 B1 * | 10/2002 | Wagner | 361/694 |
| 6,526,333 B1 | 2/2003 | Henderson et al. | |
| 6,601,168 B1 | 7/2003 | Stancil et al. | |
| 6,836,030 B2 | 12/2004 | Smith et al. | |
| 6,924,981 B2 * | 8/2005 | Chu et al. | 361/696 |

FOREIGN PATENT DOCUMENTS

| | | |
|---|---|---|
| DE | 200114240 | 2/2002 |
| DE | 202004001541 | 7/2004 |
| JP | 05226864 | 9/1993 |
| JP | 05259674 | 10/1993 |
| WO | WO02/071820 | 9/2002 |

\* cited by examiner

*Primary Examiner*—Gregory D Thompson

(57) ABSTRACT

The present invention relates to a housing assembly for computer hardware and includes side wall panels that define an outer casing that has an air inlet and outlet. The housing assembly also includes a fan and operation of the fan causes streams of air to enter and exit from the inlet and outlet and air to be conveyed within the outer casing to which heat from the computer hardware can be transferred. The housing assembly also includes a noise reduction assembly that includes a tortuous passageway through which air passing through the inlet and/or outlet passes. The tortuous passageway is configured such that sound that is emitted from the fan and enters into the tortuous passageway is dissipated therein so as to minimize the level of sound emanating from the passageway.

14 Claims, 3 Drawing Sheets

HOUSING ASSEMBLY FOR A COMPUTER

FIELD OF THE INVENTION

The present invention relates to housing assemblies in which computer hardware can be mounted to facilitate its operation. More particularly, the present invention relates to technology for reducing the noise emanating from computer housing assemblies caused by cooling fans.

BACKGROUND OF THE INVENTION

When computer hardware is operated a vast majority of the electrical energy supplied to the hardware is converted into heat. In order to prevent computer hardware from over heating, it is common for the computer housings of desktop computers and computer server modules to include a cooling fan driven by a small electric motor that blows air through the computer housing assembly. During operation, heat generated by the computer hardware is transferred to the air conveyed through the housing assembly by the cooling fan.

Over the last ten or so years, desktop computers and computer server modules have progressively becoming more compact and more powerful and as a result, the amount of the heat being generated within a given volume of the computer housing assembly has increased. In order to prevent over heating of the computer hardware, the computer housing assemblies have been fitted with fans with larger blades, blades with more complex surfaces or fans that rotate at a higher revolution to increase the flow rate of the air through the computer housing.

A problem with modifying a cooling fan according to either of these approaches is that the noise created by the fan and thus emanating from the computer housing will also increase. In some instances, the noise created by the fan and emanating from the computer housing is at a level that is above acceptable occupational health and safety standards and hence, there is a need to reduce the level of noise.

SUMMARY OF INVENTION

According to an embodiment of the present invention there is provided a housing assembly in which computer hardware can be mounted to facilitate its operation. The housing assembly includes side wall panels that define an outer casing that has an air inlet for supplying air into the casing and an air outlet for discharging air from the casing. The housing assembly also includes a fan and electric motor for driving the fan. The fan is connected to the outer casing of the housing assembly so that operation of the fan causes: i) a stream of air to enter the casing through the air inlet; ii) air to be conveyed within the outer casing; and iii) a stream of air to be discharged from the air outlet. In the event that computer hardware is mounted inside the housing and operated, heat generated by the computer hardware can be transferred to the air conveyed through the outer casing. The housing assembly also includes a noise reduction assembly that includes a tortuous passageway through which one or both of the steams of air entering the inlet or discharged from the outlet of the outer casing passes. The tortuous passageway is configured such that sound that is emitted from the fan and enters into the tortuous passageway is dissipated therein so as to minimize the level of sound emanating from the passageway.

The present invention will now be described in further detail with reference to the accompanying drawings. The drawings may be summarized as follows.

DETAILED DESCRIPTION

Figure 1A:
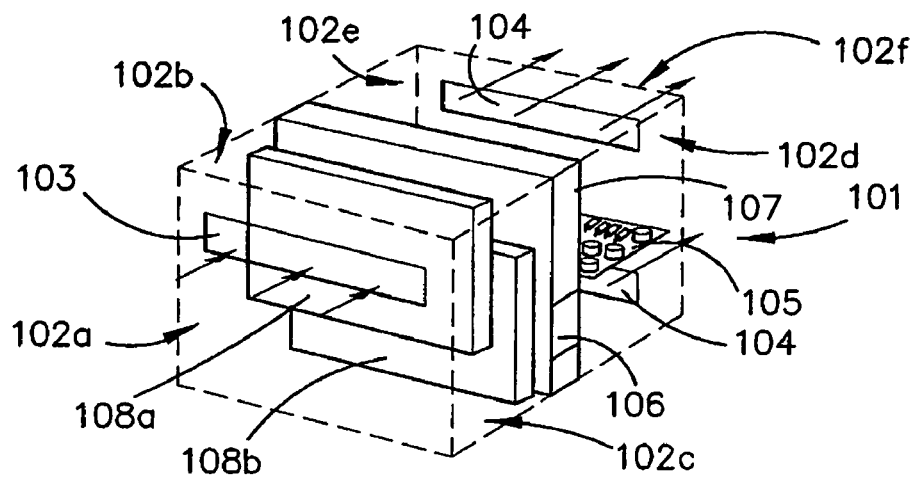
FIG. 1A illustrates a perspective view of a housing assembly in accordance with an embodiment of the present invention, the housing assembly includes outer side wall panels of the housing shown in dashed lines.

FIG. 1A is a perspective view of a computer housing assembly 101 in which items of computer hardware such RAM, ROM, motherboards, hard drives, CD drives and floppy disk drives can be mounted and interconnected in working relationship. The computer housing 101 may be any type of computer including desktop computers and server modules that when combined with similar modules form a server of a computer network.

The computer housing 101 includes six side wall panels 102a to f which are represented in FIG. 1A as dashed lines which define an outer casing. Although not shown in the Figs, the computer housing 101 may also include internal structures commonly found in the computer housings such as brackets, support plates and framework for mounting computer hardware items. The side wall panels 102a to f include front and rear panels having an air inlet 103 and two air outlets 104 respectively. Mounted inside the rear side wall panel 102f is a set of computer hardware items 105 that generate heat when operated and require cooling by transferring heat to air conveyed through the outer casing. Located forward of the computer hardware items 105 is a fan 107 and an electrical motor 106 for driving the fan 107. The fan 107 blows air toward and over the computer hardware items 105. The fan 107 may be any suitable fan such as a propeller bladed fan or a vane type fan and motor.

Figure 1B:
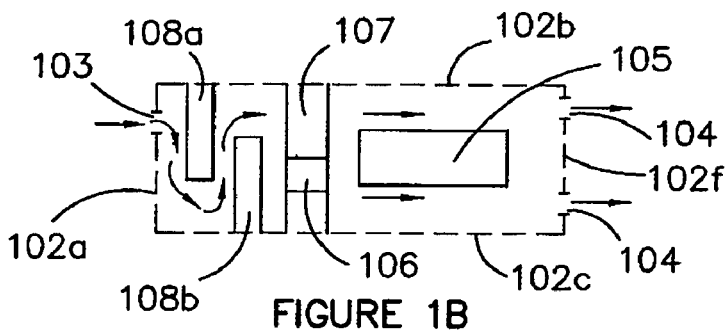
FIG. 1B illustrates a cross-sectional side view of the housing assembly shown in FIG. 1A in accordance with an embodiment of the present invention.

Situated between the fan 107 and the air inlet 103 is a sound adsorbing assembly including two rectangular shaped baffles 108a and b that define a tortuous passageway through which air is conveyed. As can be seen in FIG. 1B, the baffle 108a nearest the air inlet 103 is connected to a top side wall panel 102b and the baffle 108b nearest the fan 107 extends upwardly from the bottom side wall panel 102c in spaced relation to the baffle 108a nearest the air inlet 103. The baffles 108a and b extend across the width of the outer casing such that a cross-sectional area of the passageway lateral to the direction of the flow of air through the passageway is substantially constant. Ideally, the cross-sectional area of the passageway is at least equal to the area of the air inlet 103 such that the sound absorbing assembly does not cause a pressure drop inside the computer house. In other words, it is anticipated that the sound absorbing assembly may be retrofitted to some existing computer housing assemblies without modifying or upgrading the fan to a more powerful fan.

As can be seen in the FIGS. 1A and 1B, the tortuous passageway causes a stream of air entering the air inlet 103 to initially change direction 90 degrees downwardly, followed by two corner sections that cause a change in direction by 180 degrees, and finally a 90 degree change in direction as the air enters the fan. It is possible that the tortuous passageway may include two or more sections that change the direction of an air stream conveyed therein by 90 degrees or more. However, a more convoluted passageway that includes one or more sections that changes direction of an air stream over a range from 30 to 360 degrees is also possible.

In use, a stream of air is drawn in through the air inlet 103 and through the tortuous passageway before entering the fan 107. In essence the tortuous passageway provides a sound absorbing obstacle that prevents a direct line between the blades of the fan 107, which is the primary source of noise in the computer housing and the air inlet 103. Noise emitted from the fan 107 or other sources inside the computer housing that enters into the passageway is dissipated therein by the sound absorbing material. This effect is further enhanced by the fact that the passageway for conveying air between the air inlet 103 and the fan 107 is a tortuous passageway which maximizes sound deflection and absorption and, therefore, minimizes sounding emanating from the computer housing.

Accordingly, we have found that the sound absorbing assembly as shown in FIGS. 1A and 1B can reduce the level of sound emanating from the housing assembly by as much as 10 dB or possibly more. Under normal circumstances the reduction in noise is at least 2 dB.

Figure 2:
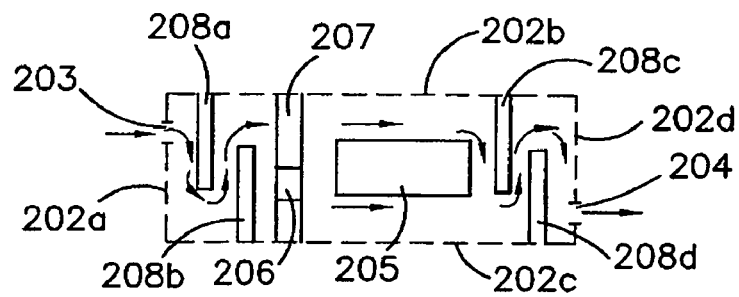
FIGS. 2 to 5 illustrate cross-sectional side views of a housing assembly according to alternative embodiments of the present invention.

FIG. 2 is a cross-sectional side view of a computer housing according to an alternative embodiment of the present invention. The computer housing includes side wall panels 202a to d that define an outer casing that is represented by dashed lines. Computer hardware 205 that generates heat during operation and requires cooling by airflow is mounted inside the outer casing. The side wall panels include a front and rear side wall panel 202a and b respectively that include an air inlet 203 and an air outlet 204. A fan 207 and electric motor 206 for conveying air inside the computer housing is located forwardly of the computer hardware 205. A sound absorbing assembly in the form of four baffles 208a to d is arranged inside the housing. Two baffles 208c and d are located between the air inlet 203 and the fan 206 and two baffles 208c and d are located between the air outlet 204 and the computer hardware 205. The baffles 208a to d form tortuous passageways such that sound emitted by the fan 207 or other components inside the housing that enters the passageway will dissipate to some extent therein and, therefore, minimize the level of noise emanating from the computer housing.

Figure 3:
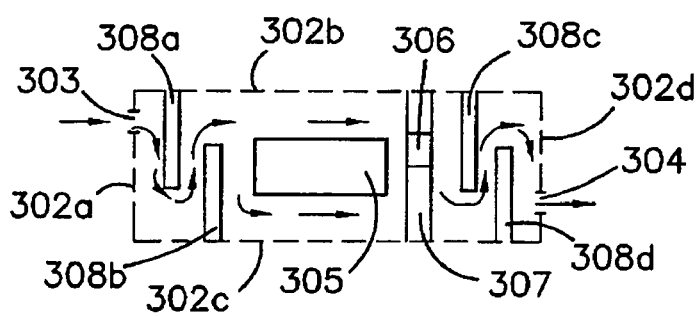

FIG. 3 is a cross-sectional side view of a computer housing according to an alternative embodiment of the present invention. The computer housing includes side wall panels 302a to d that define an outer casing that is represented by dashed lines. Computer hardware 305 that generates heat during operation and requires cooling by airflow is mounted inside the outer casing. The side wall panels include a front 302a and rear 302d side wall panel that include an air inlet 303 and an air outlet 304 respectively. A fan 307 and electric motor 306 for conveying air inside the computer housing is located adjacent a rearward end of the computer hardware 305. A sound absorbing assembly in the form of four baffles 308a to d are arranged inside the housing. Two baffles 308a and b are located between the air inlet 303 and the computer hardware 305 and two baffles 308c and d are located between the air outlet 304 and the fan 307. The baffles 308a to d form tortuous passageways such that sound emitted by the fan 307 or other components inside the housing that enters the passageway will dissipate to some extend therein and, therefore, minimize the level of noise emanating from the computer housing.

Figure 4:
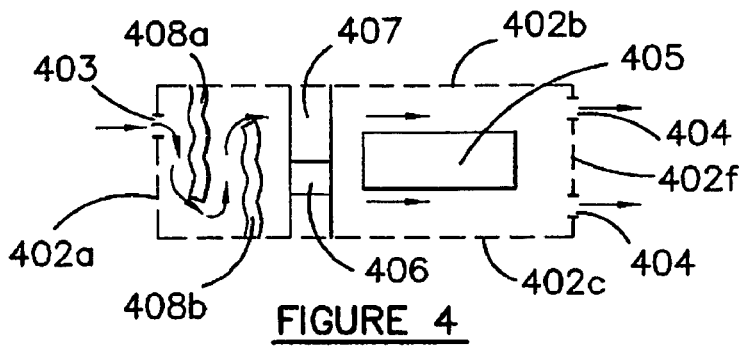

FIG. 4 is a cross-sectional side view of a computer housing according to yet another alternative embodiment of the present invention. The computer housing includes side wall panels 404a to d that define an outer casing that is represented by dashed lines. Computer hardware 405 that generates heat during operation and requires cooling by airflow is mounted inside the outer casing. The side wall panels include a front 402a and rear 402d side wall panels that include an air inlet 403 and two air outlets 404 respectively. A fan 407 and electric motor 406 for conveying air inside the computer housing is located adjacent a rearward end of the computer hardware. A sound absorbing assembly in the form of 2 baffles 408a and b between the air inlet 403 and the computer hardware 405. The baffles 408a and b have curved surfaces that are design to increase the dissipation of sound emitted from the fan 407 or other components located inside the computer housing. The baffles 408a and b also define a tortuous passageway for conveying air from the air inlet 403 to the fan 407 so as to prevent a direct line from the fan 407 to the air inlet 403. Sound emitted by the fan or other components inside the housing that enters the passageway will dissipate to some extend therein and, therefore, minimize the level of noise emanating from the computer housing.

Figure 5:
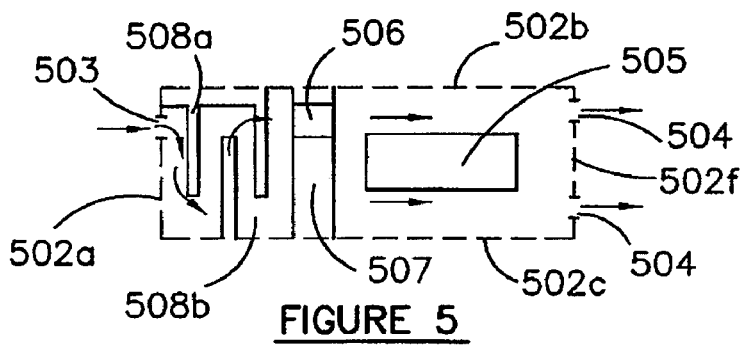

FIG. 5 is a cross-sectional side view of a computer housing according to an yet another alternative embodiment of the present invention. The computer housing includes side wall panels 502a to d that define an outer casing that is represented by dashed lines. Computer hardware 505 that generates heat during operation and requires cooling by airflow is mounted inside the outer casing. The side wall panels include a front 502a and rear 502c side wall panels that include an air inlet 503 and an air outlet 504 respectively. A fan 507 and electric motor 506 for conveying air inside the computer housing is located adjacent a rearward end of the computer hardware. A sound absorbing assembly is in the form of 3 baffles 508a to c between the air inlet 503 and the computer hardware. The baffles 508a to c are located in an interleaved and spaced relationship such that a central baffle 508b is flanked by two side baffles 508a and c and defines a more convoluted tortuous passageway than the passageway shown in FIG. 1A and, therefore, may offer more sound absorbing properties. Sound emitted by the fan 507 or other components inside the housing that enters the passageway will dissipate to some extend therein and, therefore, minimize the level of noise emanating from the computer housing.

Figure 6:
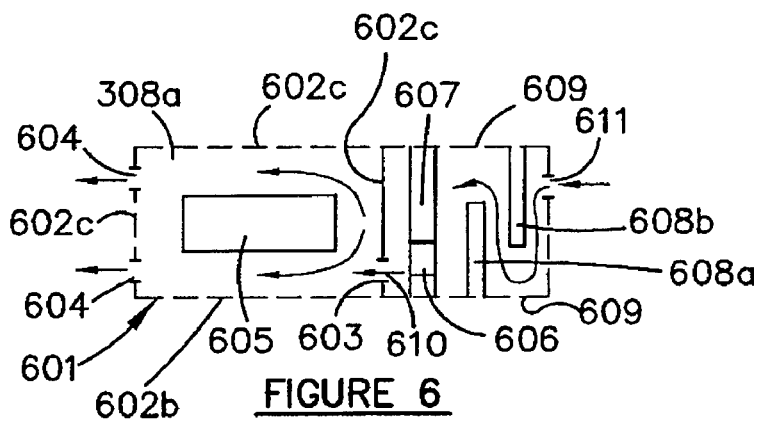
FIGS. 6 to 10 illustrate cross-sectional side views of a housing assembly containing computer hardware fitted with a cooling system in accordance with alternative embodiments of the present invention.

FIG. 6 is a cross-sectional side view of a cooling system according to an embodiment of the present invention that is adapted to be fitted to a housing assembly 601 containing computer hardware 605 that generates heat during operation and requires cooling by airflow. The housing assembly includes side wall panels 602a to d that define an outer casing. The side wall panels include a front 602a and rear 602c side wall panels that include an air inlet 603 and two air outlets 604, respectively.

The cooling system includes a structural assembly 609 to which a fan 607 and electric motor 606 are mounted. The structural assembly can be fitted to the front side wall panels 602a of the computer housing assembly 601 such that operation of the fan 607 causes a stream of air to enter into the computer housing via the air inlet 603 and to exit the housing via the air outlets 604. The cooling system also includes a sound absorption assembly contained within the structural assembly 609 to which the fan 607 and electric motor 606 are mounted. The sound absorption assembly includes two rectangular shaped baffles 608*a* and *b* made of the sound absorption material that define a tortuous passageway for air passing through the fan. The structural assembly of the cooling system also includes its own air inlet 611 and an air outlet 610 that communicates with the air inlet 603 of the housing assembly.

In use, sound that is emitted from fan 606 and enters the tortuous passageway is dissipated to some extent therein so as to minimize the total level of the noise emanating from the passageway.

Figure 7:
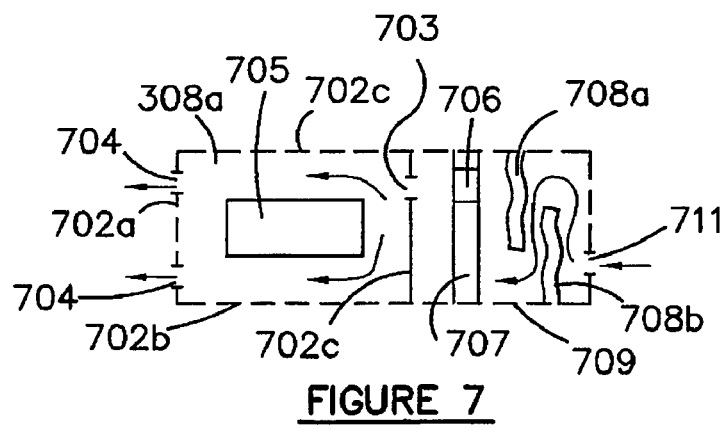

FIG. 7 is a cross-sectional side view of a cooling system according to another embodiment of the present invention that is adapted to be fitted to a housing assembly containing computer hardware 705 that generates heat during operation and requires cooling by airflow. The housing assembly includes side wall panels 702*a* to *d* that define an outer casing. The side wall panels include a front 702*a* and rear 702*c* side wall panels that include an air inlet 703 and two air outlets 704, respectively.

The cooling system includes a structural assembly 709 to which a fan 707 and electric motor 706 are mounted. The structural assembly 709 that can be fitted to either the rear 702*a* or front 702*c* side wall panels of the computer housing assembly. The structural assembly 709 of the cooling system also includes its own air inlet 711 and an air outlet 710 that communicates with the air inlet 703 of the housing assembly such that operation of the fan causes a stream of air to enter and be discharged from the computer housing.

The cooling system also includes a sound absorption assembly contained within the structural assembly to which the fan 707 and electric motor 706 are mounted. The sound absorption assembly includes two curved baffles 708*a* and *b* that have been shaped so as to maximize the adsorption of the sound frequencies emitted from the fan. The baffles 708*a* and *b* are made of sound adsorption material and are arranged between the fan 707 and the air inlet 711 of the structural assembly. In use, sound that is emitted from fan 707 and enters the tortuous passageway is dissipated to some extent therein so as to minimize the total level of the noise emanating from the passageway.

Figure 8:
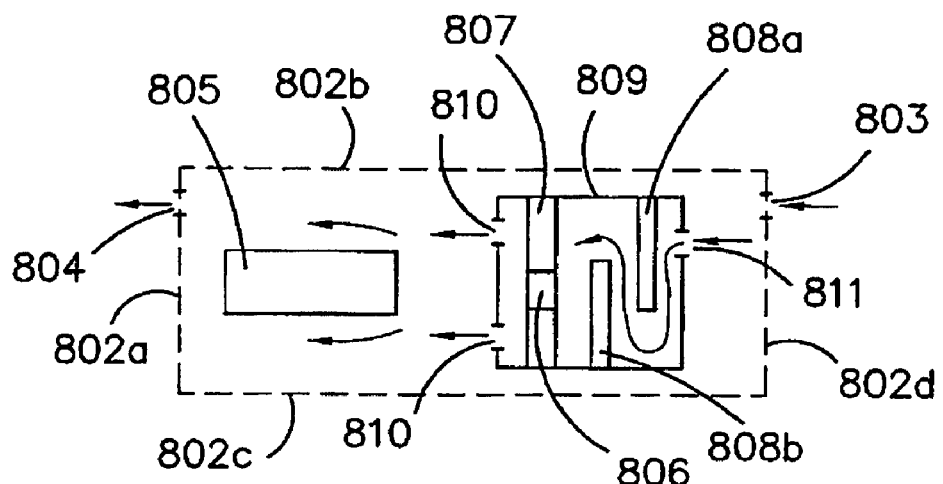

FIG. 8 is a cross-sectional side view of a cooling system according to an embodiment of the present invention, wherein the cooling system is fitted to the inside of a housing assembly containing computer hardware. It is possible that two or more of such cooling systems may also be fitted to the inside of a housing assembly so that one of the cooling systems generally cools hardware inside the housing assembly and the other cooling assembly is a dedicated cooler for cooling computer hardware such as a CPU. The cooling assembly shown in FIG. 8 includes only one cooling assembly in a housing assembly.

The housing assembly includes side wall panels 802*a* to *d* that define an outer casing having an air inlet 803 and an air outlet 804. The computer hardware 805 is contained within the outer casing.

The cooling system includes a structural assembly 809 to which the fan 807 and electrical motor 806 are mounted. The structural assembly 809 also includes its own air inlet 811 and two air outlets 810. If desired, the outlets 810 may be directed to specific hardware components such as a CPU that generates large amounts of heat and, therefore, requires additional cooling.

The cooling system includes a sound absorption assembly contained within the structural support 809. The sound absorption assembly includes two baffles 808*a* and *b* located between the fan 807 and the air inlet 811 to the structural assembly.

Figure 9:
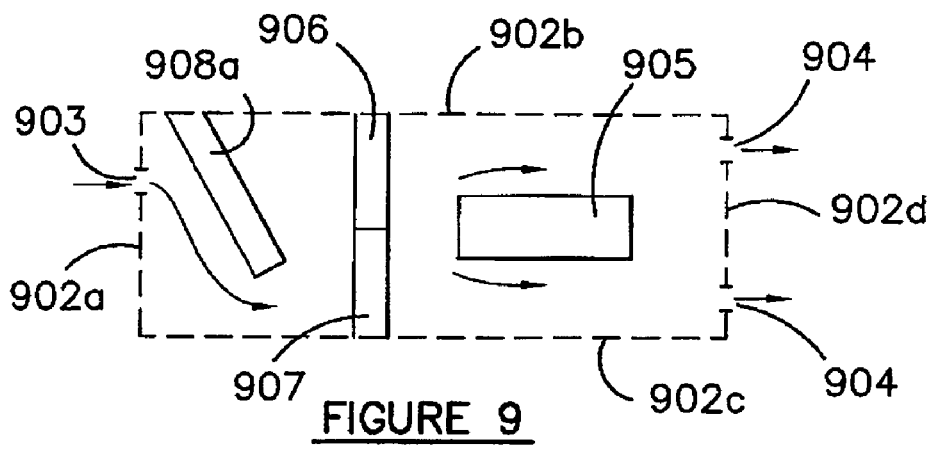

FIG. 9 is a cross-sectional side view of a computer housing according to an alternative embodiment of the present invention. The computer housing includes side wall panels 902*a* to *d* that define an outer casing of the computer housing. Computer hardware 905 that generates heat during operation and requires cooling by air flow is mounted inside the outer housing. The side wall panels include a front 902*a* and rear 902*d* side wall panels that include an air inlet 903 and an air outlet 904 respectively. A fan 907 and electric motor 906 for conveying air inside the computer housing is located adjacent to a forward end of the computer hardware 905. A sound absorbing assembly in the form of a panel located at an angle to the top side wall 902*b* between the air inlet 903 and the fan 907. The baffle 908*a* defines an air passageway that changes the direction of the air as it enters the computer housing by approximately 30 degrees such that sound emitted from the fan 907 is deflected and absorbed to some extent by the baffle 908*a* so as to reduce the level of sound emanating from the computer housing.

Figure 10:
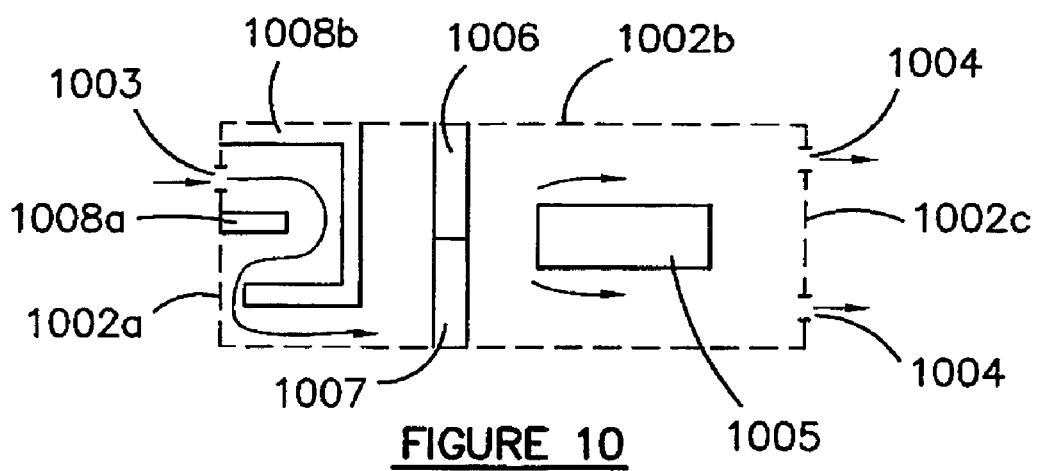

FIG. 10 is a cross-sectional side view of a computer housing according to yet another alternative embodiment of the present invention. The computer housing includes side wall panels 1002*a* to *d* that define an outer casing of the computer housing. Computer hardware 1005 that generates heat during operation and requires cooling by air flow is mounted inside the outer casing. The front and rear side wall panels 1002*a* and 1002*d* include an air inlet 1003 and two air outlets 1004 respectively. A fan 1007 and electric motor 1006 are located adjacent to a forward end of the computer hardware 1005. A sound absorbing assembly in the form of two baffles 1008*a* and 1008*b* is located between the air inlet 1003 and fan 1007. Baffle 1008*a* extends laterally inward from the front wall panel 1002*a* and baffle 1008*b* has a U shaped cross-section that straddles the baffle 1008*a* and thereby defines a tortuous passageway through which air being conveyed changes direction twice by approximately 180 degrees. Sound emitted by the fan 107 or other components inside the housing that enters the passageway will be dissipated to some extent therein and, therefore, minimise the level of noise emanating from the computer housing.

The baffles shown in any one of FIGS. 1A to 10 may be made of the any suitable sound absorbing material including, but by no means limited to: low, high or medium density foam; fabric containing cellulosic, metallic or synthetic fibers; a polymeric resin material; or a material capable of being pre-molded. It is also possible that the embodiments shown in FIGS. 1 to 10 may include any number of baffles that define a tortuous passageway. For example, 2, 3, 4, 5 or even more baffles may be interleaved in spaced relationship to form a tortuous passageway. The baffles may also include curved, dimpled or embossed surfaces to increase their sound absorption properties. As mentioned above, it is possible that the baffles define a tortuous passageway that changes direction one or more times and the extent to which the passageway changes direction may vary, for example, from 30 to 360 degrees.

In addition, it is also possible that any one of embodiments mentioned above may include two or more fans for conveying air inside the housing assembly. In this situation, sound emitted from each fan can enter the passageway and be dissipated therein in much the same manner as if the embodiments only included one fan.

It will be appreciated by those skilled in the art of the present invention that the above description of has been presented only for the purpose of illustration and description and is not intended to be exhaustive or to limit the invention to the precise forms described. Many modifications and variations may be made to the embodiments shown in the drawings without departing from the spirit and scope of the invention.

For example, although not shown in FIGS. 1A to 7, it is possible that housing assembly may also include one or more additional passageways for directing portions of the air conveyed through the outer casing to specific regions or items of computer hardware inside the housing. This may be required if specific hardware items require more cooling then other hardware items.

The invention claimed is:

1. A housing assembly in which items of computer hardware can be mounted to facilitate their operation, the housing assembly comprising:
   a) a plurality of side wall panels that define an outer casing. the plurality of panels forming a plurality of air vents that define an air inlet and an air outlet;
   b) a fan and electric motor for driving the fan, wherein the fan is connected to the outer casing such that operation of the fan causes; i) a stream of air to enter the outer casing through the air inlet, ii) the stream of air to be conveyed within the outer casing, and iii) the stream of air to be discharged from the air outlet, thereby allowing heat generated by the computer hardware inside the outer casing to be transferred to the air conveyed within the outer casing; and
   c) a baffle interposed between the fan and a first vent of the plurality of air vents such that the stream of air forms a tortuous passageway extending between the fist vent and the fan along a nonlinear path around an edge of the baffle, wherein the vent is in a first panel of the plurality of side wall panels, and wherein the baffle extends from a second panel of the plurality of side wall panels, second panel being connected to the first panel.

2. The housing assembly according to claim 1, wherein the plurality of side wall panels of the outer casing include front and rear panels at oppositely disposed ends of the outer casing, and the front panel includes said air inlet and the rear panel includes said air outlet, and the tortuous passageway is located between the air inlet and the fan which is disposed forwardly of a region in the housing assembly for mounting computer hardware.

3. The housing assembly according to claim 1, wherein the baffles is made of a sound absorbing material.

4. The housing assembly according to claim 3, wherein the baffles is made of a foam material.

5. The housing assembly according to claim 1, wherein the tortuous passageway includes one or more than one corner sections in which the passageway changes direction by 90 degrees or more.

6. The housing assembly according to claim 1, wherein the fan is between the computer hardware and the baffle along the stream of air.

7. The housing assembly according to claim 6, wherein the baffle is at an angle of 90 degrees from the second panel.

8. The housing assembly according to claim 6, wherein the baffle is at an angle of 60 degrees from the second panel.

9. The housing assembly according to claim 6, and further comprising a second baffle interposed between the fan and the first baffle such that a portion of the tortuous passageway that lies between the fan and the first baffle extends along a nonlinear path around an edge of the second baffle, wherein the second baffle extends from a third panel of the plurality of side wall panels, the third panel being connected to the first panel on an opposite side of the outer casing from the second panel.

10. The housing assembly according to claim 9, wherein a cross-section of the tortuous passageway lateral to the direction of flow of air therein is substantially constant.

11. The housing assembly according to claim 9, and further comprising a third baffle interposed between the fan and the second baffle such that a portion of the tortuous passageway that lies between the fan and the second baffle extends along a nonlinear path around an edge of the third baffle, wherein the third baffle extends from the second panel of the plurality of side wall panels.

12. The housing assembly according to claim 6, and further comprising a second baffle interposed between the fan and a second vent of the plurality of air vents such that the stream of air forms a second tortuous passageway extending between the second vent and the fan along a nonlinear path around an edge of the second baffle, wherein the second vent is in a third panel of the plurality of side wall panels, the third panel being on the opposite side of the outer casing from the first panel.

13. The housing assembly according to claim 12, and further comprising a third baffle interposed between the fan and the first baffle such that a portion of the first tortuous passageway that lies between the fan and the first baffle extends along a nonlinear path around an edge of the third baffle, wherein the third baffle extends from a third panel of the plurality of side wall panels, the third panel being connected to the first panel on an opposite side of the outer casing from the second panel.

14. The housing assembly according to claim 6, wherein the baffle is characterized by a wavy curved surface.

* * * * *

UNITED STATES PATENT AND TRADEMARK OFFICE
CERTIFICATE OF CORRECTION

PATENT NO. : 7,286,348 B2
APPLICATION NO. : 10/989922
DATED : October 23, 2007
INVENTOR(S) : Wade D. Vinson et al.

It is certified that error appears in the above-identified patent and that said Letters Patent is hereby corrected as shown below:

In column 7, line 19, in Claim 1, after "casing" delete "." and insert -- , --, therefor.

In column 7, line 32, in Claim 1, after "between the" delete "fist" and insert -- first --, therefor.

In column 7, line 47, in Claim 3, delete "baffles is" and insert -- baffle is --, therefor.

In column 7, line 49, in Claim 4, delete "baffles is" and insert -- baffle is --, therefor.

Signed and Sealed this

Twenty-ninth Day of July, 2008

JON W. DUDAS
*Director of the United States Patent and Trademark Office*